(12) United States Patent
Karam et al.

(10) Patent No.: US 7,921,307 B2
(45) Date of Patent: Apr. 5, 2011

(54) METHODS AND APPARATUS PROVIDING ADVANCED CLASSIFICATION FOR POWER OVER ETHERNET

(75) Inventors: Roger A. Karam, Mountain View, CA (US); Chad M. Jones, Doylestown, OH (US); Frederick Roland Schindler, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 677 days.

(21) Appl. No.: 11/728,743

(22) Filed: Mar. 27, 2007

(65) Prior Publication Data

US 2008/0244284 A1 Oct. 2, 2008

(51) Int. Cl.
*G06F 1/00* (2006.01)
*H04L 12/28* (2006.01)

(52) U.S. Cl. .................... 713/300; 370/400; 370/395.53

(58) Field of Classification Search .................. 713/300; 370/400, 395.53
See application file for complete search history.

(56) References Cited

U.S. PATENT DOCUMENTS

| | | |
|---|---|---|
| 4,835,737 A | 5/1989 | Herrig et al. |
| 5,018,148 A | 5/1991 | Patel et al. |
| 5,122,691 A | 6/1992 | Balakrishnan |
| 5,148,144 A | 9/1992 | Sutterlin et al. |
| 5,237,511 A | 8/1993 | Caird et al. |
| 5,268,592 A | 12/1993 | Bellamy et al. |
| 5,289,359 A | 2/1994 | Ziermann |
| 5,291,528 A | 3/1994 | Vermeer |
| 5,386,567 A | 1/1995 | Lien et al. |
| 5,406,260 A | 4/1995 | Cummings et al. |
| 5,461,671 A | 10/1995 | Sakuragi et al. |
| 5,483,574 A | 1/1996 | Yuyama |
| 5,491,804 A | 2/1996 | Heath et al. |
| 5,531,612 A | 7/1996 | Goodall et al. |
| 5,608,792 A | 3/1997 | Laidler |
| 5,613,130 A | 3/1997 | Teng et al. |
| 5,639,267 A | 6/1997 | Loudermilk |
| 5,726,506 A | 3/1998 | Wood |
| 5,742,513 A | 4/1998 | Bouhenguel et al. |

(Continued)

FOREIGN PATENT DOCUMENTS

WO  WO9623377  8/1996

OTHER PUBLICATIONS

PCT International Search Report and Written Opinion of the International Searching Authority having a date of mailing of Aug. 18, 2008 in co-pending PCT International Application No. PCT/US08/58080 with an International Filing Date of Mar. 25, 2008 with applicant being CISCO Technology, Inc. and entitled: Methods and Apparatus Proving Advanced Classificationfor Power Over Ethernet.

(Continued)

*Primary Examiner* — Vincent T Tran
(74) *Attorney, Agent, or Firm* — Patterson & Sheridan, LLP

(57) ABSTRACT

A system conducts a plurality of cycles on the powered device. Each cycle has a detection phase and a classification phase. A classification voltage is applied to the conductors during each cycle. The system measures a current in the conductors while the classification voltage is applied. The system determines a final class responsive to a plurality of measured currents. The final class utilized to determine an amount of inline power to deliver to the powered device.

21 Claims, 7 Drawing Sheets

U.S. PATENT DOCUMENTS

| | | | |
|---|---|---|---|
| 5,748,972 | A | 5/1998 | Clark et al. |
| 5,758,102 | A | 5/1998 | Carey et al. |
| 5,775,946 | A | 7/1998 | Briones |
| 5,790,391 | A | 8/1998 | Stich et al. |
| 5,790,873 | A | 8/1998 | Popper et al. |
| 5,793,987 | A | 8/1998 | Quackenbush et al. |
| 5,796,185 | A | 8/1998 | Takata et al. |
| 5,808,660 | A | 9/1998 | Sekine et al. |
| 5,809,256 | A | 9/1998 | Najemy |
| 5,834,925 | A | 11/1998 | Chesavage |
| 5,884,086 | A | 3/1999 | Amoni et al. |
| 5,884,233 | A | 3/1999 | Brown |
| 5,991,885 | A | 11/1999 | Chang et al. |
| 5,994,998 | A | 11/1999 | Fisher et al. |
| 6,033,266 | A | 3/2000 | Long |
| 6,036,547 | A | 3/2000 | Belopolsky et al. |
| 6,059,581 | A | 5/2000 | Wu |
| 6,068,520 | A | 5/2000 | Winings et al. |
| 6,099,349 | A | 8/2000 | Boutros |
| 6,115,468 | A | 9/2000 | De Nicolo |
| 6,134,666 | A | 10/2000 | De Nicolo |
| 6,162,089 | A | 12/2000 | Costello et al. |
| 6,218,930 | B1 | 4/2001 | Katzenberg et al. |
| 6,233,128 | B1 | 5/2001 | Spencer et al. |
| 6,310,781 | B1 | 10/2001 | Karam |
| 6,396,392 | B1 | 5/2002 | Abraham |
| 6,448,899 | B1 | 9/2002 | Thompson |
| 6,487,670 | B1 | 11/2002 | Racino et al. |
| 6,496,105 | B2 | 12/2002 | Fisher et al. |
| 6,541,878 | B1 | 4/2003 | Diab |
| 6,628,207 | B1 | 9/2003 | Hemminger et al. |
| 6,701,443 | B1 | 3/2004 | Bell |
| 6,762,675 | B1 | 7/2004 | Cafiero et al. |
| 6,764,343 | B2 | 7/2004 | Ferentz |
| 6,804,351 | B1 | 10/2004 | Karam |
| 6,958,699 | B1 | 10/2005 | Karam |
| 6,986,071 | B2 | 1/2006 | Darshan et al. |
| 7,089,126 | B2 | 8/2006 | Muir |
| 7,145,439 | B2 | 12/2006 | Darshan et al. |
| 7,152,168 | B2 | 12/2006 | Boynton et al. |
| 7,154,381 | B2 | 12/2006 | Lang et al. |
| 7,159,129 | B2 | 1/2007 | Pincu et al. |
| 7,162,377 | B2 | 1/2007 | Amrod et al. |
| 7,240,224 | B1 | 7/2007 | Biederman |
| 7,353,407 | B2 | 4/2008 | Diab et al. |
| 7,392,407 | B2 | 6/2008 | Jonnala et al. |
| 7,433,763 | B2 | 10/2008 | Culley |
| 7,457,252 | B2 | 11/2008 | Karam et al. |
| 7,603,570 | B2 | 10/2009 | Schindler et al. |
| 2004/0049321 | A1 | 3/2004 | Lehr et al. |
| 2004/0073597 | A1 | 4/2004 | Caveney et al. |
| 2004/0146004 | A1 | 7/2004 | Tidwell et al. |
| 2004/0146061 | A1 | 7/2004 | Bisceglia et al. |
| 2004/0190464 | A1 | 9/2004 | Tesdahl et al. |
| 2004/0260794 | A1 | 12/2004 | Ferentz et al. |
| 2005/0086546 | A1* | 4/2005 | Darshan et al. ............... 713/300 |
| 2005/0132240 | A1 | 6/2005 | Stineman et al. |
| 2005/0197094 | A1 | 9/2005 | Darshan et al. |
| 2005/0257262 | A1 | 11/2005 | Matityahu et al. |
| 2005/0262364 | A1 | 11/2005 | Diab et al. |
| 2006/0077888 | A1 | 4/2006 | Karam et al. |
| 2006/0078093 | A1 | 4/2006 | Karam et al. |
| 2006/0082220 | A1 | 4/2006 | Karam et al. |
| 2006/0092000 | A1* | 5/2006 | Karam et al. ............ 340/310.11 |
| 2006/0100799 | A1 | 5/2006 | Karam |
| 2006/0164098 | A1* | 7/2006 | Su ................................ 324/534 |
| 2006/0171399 | A1* | 8/2006 | Ferentz et al. ........... 370/395.53 |
| 2006/0212724 | A1* | 9/2006 | Dwelley et al. ............... 713/300 |
| 2006/0259798 | A1* | 11/2006 | Stanford ....................... 713/300 |
| 2007/0025452 | A1 | 2/2007 | Schindler |
| 2007/0041387 | A1* | 2/2007 | Ghoshal et al. .......... 370/395.52 |
| 2007/0103829 | A1* | 5/2007 | Darshan et al. ................. 361/90 |
| 2007/0257780 | A1 | 11/2007 | Schindler |
| 2008/0005600 | A1* | 1/2008 | Diab et al. .................... 713/300 |

OTHER PUBLICATIONS

Office Action History for U.S. Appl. No. 10/961,904, dates ranging from Oct. 1, 2009 to Mar. 30, 2010.

Office Action History for U.S. Appl. No. 11/429,906, dates ranging from Aug. 4, 2009 to Mar. 4, 2010.

3Com Corporation, 3Com IntelliJack: Model NJ220, 3Com User Guide, Nov. 2003, pp. 1-82, Version 1.0, 3Com Corporation, Marlborough, Massachusetts, USA.

IEEE Computer Society, Part 3: Carrier Sense Multiple Access with Collision Detection (CSMA/CD) Access Method and Physical Layer Specifications, Amendment: Data Terminal Equipment (DTE) Power via Media Dependent Interface (MDI), IEEE Std 802.3af-2003 (Amendment to IEEE Std 802.3-2002, including IEEE Std 802.3ae-2002), Jun. 18, 2003, pp. 1-132, The Institute of Electrical and Electronics Engineers, Inc., New York, NY, USA.

3Com, 3Com NJ100 Network Jack Power, http://www.poweroverethernet.com/manual/layout/set/print/content/view/full/776, Mar. 18, 2003, eZ Publish.

Galit Mendelson, White Paper: All You Need To Know About Power over Ethernet (PoE) and the IEEE 802.3af Standard, Jun. 2004, pp. 1-24, XP-002372480, PowerDsine Ltd.

Invitation to Pay Additional Fees (Partial International Search), Application No. PCT/US2005/036328), date of mailing May 26, 2006.

International Search Report for International Application No. PCT/US2005/036328, date of mailing Aug. 3, 2006.

Kevin Lynn. Universal Serial Bus (USB) Power Management. Sep. 15, 1998, pp. 194-201, vol. 8080 XP-000846817, IEEE. Wescon/98, Location: Anaheim, CA , USA.

International Preliminary Report on Patentability Application No. PCT/US2005/036328, date of mailing May 18, 2007.

International Search Report and Written Opinion for International Application No. PCT/US2005/036329, date of mailing Sep. 4, 2006.

3Com Corporation, 3Com Network Jack: Model NJ200, 3Com User Guide, Sep. 2002, pp. 1-56, Version 1.0 XP-002297746, 3Com Corporation, Santa Clara, California, USA.

International Search Report and Written Opinion for International Application No. PCT/US2005/036392, date of mailing Mar. 10, 2006.

IEEE Standard for a High Performance Serial Bus—Amendment 1, IEEE Std 1394a-2000 (Amendment to IEEE Std 1394-1995), Section 4.4.4.7 Cable power and ground, p. 45, Published Jun. 30, 2000, The Institute of Electrical and Electronics Engineers, Inc., New York, NY, USA.

* cited by examiner

200 CONDUCT A PLURALITY OF CYCLES ON THE POWERED DEVICE, EACH CYCLE HAVING A DETECTION PHASE AND A CLASSIFICATION PHASE, EACH CYCLE APPLYING A CLASSIFICATION VOLTAGE TO THE CONDUCTORS, AND MEASURING A CURRENT IN THE CONDUCTORS WHILE THE CLASSIFICATION VOLTAGE IS APPLIED

201 DETERMINE THE POWERED DEVICE IS CAPABLE OF RETAINING A MEMORY OF A VOLTAGE RECEIVED BY THE POWERED DEVICE.

202 DETERMINE THE MEMORY IS RETAINED BY THE POWERED DEVICE WHEN A VOLTAGE OF APPROXIMATELY EIGHT TO TEN VOLTS IS RECEIVED BY THE POWERED DEVICE

OR

203 DETERMINE THE MEMORY OF THE POWERED DEVICE IS CLEARED WHEN A VOLTAGE OF APPROXIMATELY THREE TO FIVE VOLTS IS RECEIVED BY THE POWERED DEVICE

204 DETERMINE A FINAL CLASS RESPONSIVE TO A PLURALITY OF MEASURED CURRENTS THE FINAL CLASS UTILIZED TO DETERMINE AN AMOUNT OF INLINE POWER TO DELIVER TO THE POWERED DEVICE

*FIG. 5*

205 CONDUCT A PLURALITY OF CYCLES ON THE POWERED DEVICE, EACH CYCLE HAVING A DETECTION PHASE AND A CLASSIFICATION PHASE, A RESPECTIVE CLASSIFICATION VOLTAGE APPLIED TO THE CONDUCTORS DURING EACH CYCLE, AND MEASURING A CURRENT IN THE CONDUCTORS WHILE THE CLASSIFICATION VOLTAGE IS APPLIED

206 CONDUCT EACH CYCLE WITHIN THE PLURALITY OF CYCLES SUCH THAT EACH CYCLE BEGINS WITH A DETECTION PHASE FOLLOWED BY A CLASSIFICATION PHASE, EACH OF THE THE CLASSIFICATION PHASE APPLYING A RESPECTIVE CLASSIFICATION VOLTAGE TO THE CONDUCTORS, AND MEASURING THE CURRENT IN THE CONDUCTORS WHILE THE CLASSIFICATION VOLTAGE IS APPLIED, THE PLURALITY OF CYCLES CONTAINING AT LEAST TWO CYCLES

207 CONDUCT THE DETECTION PHASE BY APPLYING AT LEAST ONE DETECTION VOLTAGE OF LESS THAN ABOUT TEN VOLTS TO DETECT A VALID POWERED DEVICE

208 DETERMINE A RESPECTIVE CLASS AT THE COMPLETION OF EACH OF THE AT LEAST TWO CYCLES, THE RESPECTIVE CLASS COMPUTED BY THE CURRENT MEASURED IN THE CONDUCTORS

*FIG. 6*

```
┌─────────────────────────────────────────────────────────────────────┐
│ 209 DETERMINE A FINAL CLASS RESPONSIVE TO A PLURALITY OF MEASURED   │
│ CURRENTS, THE FINAL CLASS UTILIZED TO DETERMINE AN AMOUNT OF        │
│ INLINE POWER TO DELIVER TO THE POWERED DEVICE                       │
│                                                                     │
│     ┌───────────────────────────────────────────────────────────┐   │
│     │ 210 DETECT THE PLURALITY OF CYCLES COMPRISES THREE        │   │
│     │ CYCLES, EACH OF THE THREE CYCLES PRODUCING A CLASS,       │   │
│     │ EACH CLASS ASSOCIATED WITH THE MEASURED CURRENT           │   │
│     │ RECEIVED AT THE POWERED DEVICE DURING EACH OF THE         │   │
│     │ THREE CYCLES, EACH OF THE AT LEAST THREE CLASSES          │   │
│     │ RECEIVED IN AN ORDER IN WHICH EACH OF THE AT LEAST        │   │
│     │ THREE CYCLES WAS COMPLETED                                │   │
│     └───────────────────────────────────────────────────────────┘   │
│                                │                                    │
│                                ▼                                    │
│     ┌───────────────────────────────────────────────────────────┐   │
│     │ 211 BASED ON THE ORDER IN WHICH THE THREE CYCLES WERE     │   │
│     │ RECEIVED, DETERMINE A FINAL CLASS ASSOCIATED WITH THE     │   │
│     │ AMOUNT OF INLINE POWER TO DELIVER TO THE POWERED          │   │
│     │ DEVICE                                                    │   │
│     └───────────────────────────────────────────────────────────┘   │
│                                │                                    │
│                                ▼                                    │
│     ┌───────────────────────────────────────────────────────────┐   │
│     │ 212 DETECT THE PLURALITY OF CYCLES COMPRISES A FOURTH     │   │
│     │ CYCLE PRODUCING A FOURTH CLASS THAT IS USED TO            │   │
│     │ DETERMINE THE AMOUNT OF INLINE POWER TO DELIVER TO        │   │
│     │ THE POWERED DEVICE BY ADDING AN INCREMENTAL VALUE TO      │   │
│     │ THE AMOUNT OF INLINE POWER THAT IS DETERMINED AS A        │   │
│     │ RESULT OF THE THREE CLASSES PRODUCED BY THE THREE         │   │
│     │ CYCLES                                                    │   │
│     └───────────────────────────────────────────────────────────┘   │
└─────────────────────────────────────────────────────────────────────┘
```

*FIG. 7*

METHODS AND APPARATUS PROVIDING ADVANCED CLASSIFICATION FOR POWER OVER ETHERNET

BACKGROUND

Inline Power (also known as Power over Ethernet or PoE) is a technology for providing electrical power over a wired data telecommunications network (such as, for example, the well-known Ethernet) from power source equipment (PSE) to a powered device (PD) over a link section. The power may be injected by an endpoint power source equipment at one end of the link section or by a midspan power source equipment along a midspan of a link section that is distinctly separate from and between the media dependent interfaces (MDIs) to which the ends of the link section are electrically and physically coupled.

PoE is defined in the IEEE (The Institute of Electrical and Electronics Engineers, Inc.) Standard Std 802.3af-2003 published 18 Jun. 2003 and entitled "IEEE Standard for Information technology—Telecommunications and information exchange between systems—Local and metropolitan area networks—Specific requirements: Part 3 Carrier Sense Multiple Access with Collision Detection (CSMA/CD) Access Method and Physical Layer Specifications: Amendment: Data Terminal Equipment (DTE) Power via Media Dependent Interface (MDI)" (herein referred to as the "IEEE 802.3af standard"). The IEEE 802.3af standard is a globally applicable standard for combining the transmission and reception (collectively: "transceiving") of Ethernet packets with the transmission and reception of DC-based power over the same set of wires in a single Ethernet cable. It is contemplated that Inline Power will power such powered devices as Internet Protocol (IP) telephones, surveillance cameras, switching and hub equipment for the telecommunications network, biomedical sensor equipment used for identification purposes, other biomedical equipment, radio frequency identification (RFID) card and tag readers, security card readers, various types of sensors and data acquisition equipment, fire and life-safety equipment in buildings, and the like. The power is direct current, floating 48 Volt power currently available at a range of power levels from about 4 watts to about 15 watts in accordance with the standard. There are mechanisms within the IEEE 802.3af standard to allocate a requested amount of power. Other proprietary schemes also exist to provide a finer and more sophisticated allocation of power than that provided by the IEEE 802.3af standard while still providing basic compliance with the standard. As the standard evolves, additional power may also become available. Conventional 8-conductor type RG-45 connectors (male or female, as appropriate) are typically used on both ends of all Ethernet connections. They are wired as defined in the IEEE 802.3af standard.

In accordance with the IEEE 802.3af standard as presently constituted, power source equipment carries out an inline power detection process, and, if successful, an optional inline power classification process. The detection process attempts to detect an identity network present at the powered device. This is usually a 25,000 ohm resistor which is detected by applying a first voltage across the inline power conductors and reading a first current drawn, then applying a second voltage and reading a second current drawn. If the detection process measures the resistance as 25,000 ohms, then a powered device capable of accepting inline power pursuant to the IEEE 802.3af standard is present. Otherwise, it is assumed that a powered device is not present. If such a powered device is present, then under the IEEE 802.3af standard an optional classification process is implemented by applying a third voltage and measuring a third current drawn. The third current drawn characterizes the powered device as a member of one of a set of five IEEE 802.3af classes. Depending upon the class, up to a certain amount of inline power should be provided to the powered device by the power source equipment.

Inline Power is also available through techniques that are non-IEEE 802.3af standard compliant as is well known to those of ordinary skill in the art. The techniques described herein are also generally applicable to systems that are not IEEE 802.3af standard compliant.

In many cases where powered devices are used, it may be desirable to provide some additional capacity to classify powered devices receiving power from power source equipments for at least the purpose of providing more power than is currently contemplated under the IEEE 802.3af standard as well as additional and more precise power gradations.

SUMMARY

Conventional technologies for classifying powered devices suffer from a variety of deficiencies. In particular, conventional technologies for classifying a powered device are limited in that conventional technologies for classifying powered devices do not provide the necessary classification for newer powered devices. For example, newer powered devices, such as telephones, require 30 watts of power to operate. Conventional technologies classifying powered devices delivered a maximum of 15 watts, thus necessitating a new standard to provide inline power to both the newer powered devices and the existing older devices. As discussed in the application incorporated by reference above entitled known "POWERED DEVICE CLASSIFICATION IN A WIRED DATA TELECOMMUNICATIONS NETWORK" (US 2006/00920000), the classification process is carried out by the power source equipment by performing a detect cycle followed by three classification cycles. The detect cycle comprises the power source equipment delivering a voltage to the powered device, and calculating the resulting current. The value of the resulting current is used to determine a classification for each of the three cycles. The responses to the three classification cycles provide the power source equipment with data to determine the correct inline power to deliver to the powered device. This classification process can classify both newer powered devices and older powered devices, even when legacy power source equipment performs the classification process.

Embodiments disclosed herein significantly overcome such deficiencies and provide a system that includes a powered device classifying process. The powered device classifying process provides additional embodiments that complement the current IEEE standard of the power source equipment by performing a detect cycle after each of at least two classification cycles.

The powered device classifying process classifies a powered device, coupled to power sourcing equipment, to receive inline power from the power sourcing equipment in a wired data telecommunications network having at least two pairs of conductors coupling the powered device and the power sourcing equipment. The powered device must be capable of storing memory of the voltages received from the power source equipment, and of the powered device's previous and future states to such a device. In one embodiment, the powered device must retain memory for a voltage received of generally nine volts (plus or minus one volt). The powered device must clear the memory at a voltage of generally four volts (plus or minus one volt). It should be noted that the powered device memory permits the powered device to create a state machine. The state machine permits the powered device to establish that a new or legacy power sourcing equipment is attached to powered device.

The powered device classifying process conducts a plurality of cycles on the powered device, at least two cycles are used, such a limit may be set by the legacy of heat or power dissipated in the circuitry of a legacy 802.3af powered device when subjected to many cycles over the total time interval of the many classification cycles. In an example embodiment, three cycles are performed. Each cycle has a detection phase followed by a classification phase. The powered device classifying process conducts the detection phase by applying at least one detection voltage of, for example, less than ten volts to establish that the powered device classifying process is communicating with a valid powered device. In an example embodiment, the powered device detection phase applies two voltages. Each of the two voltages is less than 10 volts, and each of the two voltages is at least 1 volt different from the other voltage. While the detection algorithm discussed in this disclosure points to a detection 'cycle' below 10 v or one or more measurements of voltage and current to keep the process backward compatible with the 802.3af standard, variations on such detection algorithm may be deployed where the voltage ranges outside the 0-10 v (detection) and 15-20 v (classification) as specified by the IEEE 802.3af standard can be used, for example, the 10-15 v range, and single or multiple detection points may be used.

Each detection phase is followed by a classification phase. Each classification phase applies a classification voltage to the conductors, and measures a current in the conductors while the classification voltage is applied. The powered device classifying process determines a final class responsive to a plurality of measured currents. The final class is utilized to determine an amount of inline power to deliver to the powered device. In other words, three cycles (of a detection phase followed by a classification phase) are performed. Each of the three classification phases results in a measured current that is correlated to a class. The three cycles result in three classes ordered in the sequence in which the three cycles are performed. The three classes are correlated to a final class. The final class determines the amount of inline power the power source equipment needs to deliver to the powered device. While this generated set of new classes can be deployed to indicate power level and requirements over 2-pairs or 4-pairs inline power, these classes may indicate other 'type' of devices requiring redundancy, a sleep mode, and a host of other 'indicators' agreed upon in a look-up table fashion and pre-defined to be detected in the encoded multiple classification cycles.

In one embodiment, a fourth cycle is conducted by the powered device classifying process. The result of the fourth cycle is used to add an incremental value to the amount of inline power determined as a result of the previous three cycles. Thus, the three cycles are utilized to determine a final class. A fourth cycle (comprising a detection phase followed by a classification phase) is conducted resulting in a measured current that is correlated to a fourth class. The fourth class determines an incremental wattage to add to the amount of inline power that was determined by the previous three cycles. Thus, if the three cycles determined a wattage of 15.5 watts is required, and the fourth class determines an incremental wattage of 2 watts, the resulting required wattage is 17.5 watts.

During an example operation of one embodiment, suppose power source equipment is classifying a powered device. The powered device classifying process conducts a detection phase to determine if the powered device is valid by applying two detection voltages of between 8 and 10 volts and measuring the resulting current. The powered device classifying process conducts a classification phase by applying a classification voltage of, for example, seventeen volts, measuring the resulting current, and classifying the resulting current. At the conclusion of the first cycle of a detection phase and a classification phase, the powered device classifying process has determined the powered device is classified as a class 0. The powered device classifying process repeats the cycle a second and third time, resulting in classifications of 2 and 0 respectively. The powered device classifying process determines the resulting sequence of the three cycles (i.e., "020") results in a final classification of a new class designated in a look-up table and assigned a specific power level, or a 'tag' (i.e., a device requiring sleep mode, conveying min and max power for a device, or simply a device necessitating 35 watts of inline power to be delivered from the power source equipment to the powered device).

Other embodiments disclosed herein include any type of computerized device, workstation, handheld or laptop computer, or the like configured with software and/or circuitry (e.g., a processor) to process any or all of the method operations disclosed herein. In other words, a computerized device such as a computer or a data communications device or any type of processor that is programmed or configured to operate as explained herein is considered an embodiment disclosed herein.

Other embodiments that are disclosed herein include software programs to perform the steps and operations summarized above and disclosed in detail below. One such embodiment comprises a computer program product that has a computer-readable medium including computer program logic encoded thereon that, when performed in a computerized device having a coupling of a memory and a processor, programs the processor to perform the operations disclosed herein. Such arrangements are typically provided as software, code and/or other data (e.g., data structures) arranged or encoded on a computer readable medium such as an optical medium (e.g., CD-ROM), floppy or hard disk or other a medium such as firmware or microcode in one or more ROM or RAM or PROM chips or as an Application Specific Integrated Circuit (ASIC). The software or firmware or other such configurations can be installed onto a computerized device to cause the computerized device to perform the techniques explained herein as embodiments disclosed herein.

It is to be understood that the system disclosed herein may be embodied strictly as a software program, as software and hardware, or as hardware alone. The features, as explained herein, may be employed in data communications devices and other computerized devices and software systems for such devices such as those manufactured by Cisco Systems, Inc. of San Jose, Calif.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

FIG. 5 illustrates a flowchart of a procedure performed by the system of FIG. 1 when the powered device classifying process conducts a plurality of cycles on the powered device, each cycle having a detection phase and a classification phase, according to one embodiment disclosed herein.

FIG. 6 illustrates a flowchart of a procedure performed by the system of FIG. 1 when the powered device classifying process conducts a plurality of cycles on the powered device such that each cycle begins with a detection phase followed by a classification phase, each of the classification phase applying a classification voltage to the conductors, and measuring the current in the conductors while the classification voltage is applied, according to one embodiment disclosed herein.

FIG. 7 illustrates a flowchart of a procedure performed by the system of FIG. 1 when the powered device classifying process determines a final class responsive to a plurality of measured currents, according to one embodiment disclosed herein.

DETAILED DESCRIPTION

Figure 1:
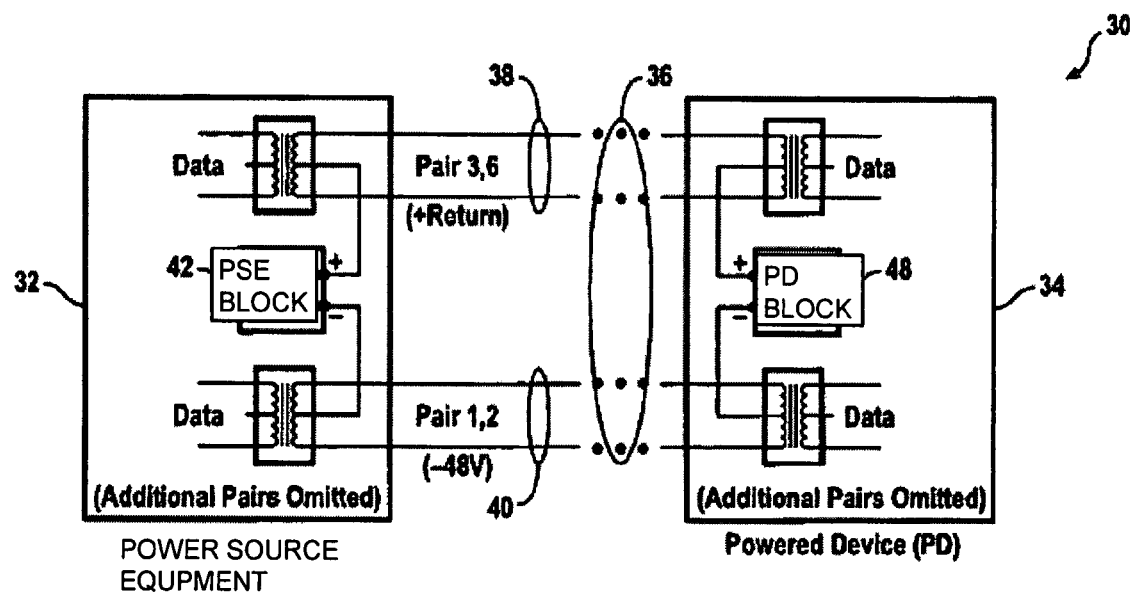
FIG. 1 illustrates an example configuration of an electrical schematic diagram of a network segment as disclosed herein.

Embodiments disclosed herein include a computer system executing a powered device classifying process. The powered device classifying process classifies a powered device, coupled to power sourcing equipment, to receive inline power from the power sourcing equipment in a wired data telecommunications network having at least two pairs of conductors coupling the powered device and the power sourcing equipment. The powered device must be capable of storing memory of the voltages received from the power source equipment and storing its own states previous and future states. In one embodiment, the powered device must retain memory for a voltage received of generally nine volts (plus or minus one volt). The powered device must clear the memory at a voltage of generally four volts (plus or minus one volt).

The powered device classifying process conducts a plurality of cycles on the powered device. Each cycle has a detection phase followed by a classification phase. The powered device classifying process conducts the detection phase by applying at least one detection voltage of, for example, less than ten volts to detect a valid powered device. Each detection phase is followed by a classification phase. Each classification phase applies a classification voltage to the conductors, and measures a current in the conductors while the classification voltage is applied. The powered device classifying process determines a final class responsive to a plurality of measured currents. The final class is utilized to determine an amount of inline power to deliver to the powered device, but the use of such a class may vary in scope. In other words, three cycles (of a detection phase followed by a classification phase) are performed. Each of the three classification phases results in a measured current that is correlated to a class as defined currently in the 802.3af standard. While such classes exist today, potentially one can define new classes similar to the classes defined in the 802.3af standard, by defining new current ranges and associating new classes with them, enabling more combination of multiple detect/class codes increasing the total set. The three cycles result in three classes ordered in the sequence in which the three cycles are performed. The three classes are correlated to a final class. The final class determines the amount of inline power the power source equipment needs to deliver to the powered device.

In one embodiment, a fourth cycle is conducted by the powered device classifying process. The result of the fourth cycle is used to add an incremental value to the amount of inline power determined as a result of the previous three cycles. Thus, the three cycles are utilized to determine a final class. A fourth cycle (comprising a detection phase followed by a classification phase) is conducted resulting in a measured current that is correlated to a fourth class. The fourth class determines an incremental wattage to add to the amount of inline power that was determined by the previous three cycles. Thus, if the three cycles determine wattage of 15.5 watts is required, and the fourth class determines an incremental wattage of 2 watts, the resulting required wattage is 17.5 watts.

FIG. 1 illustrates an example network segment 30 that includes power source equipment 32 (such as a switch or hub) capable of providing inline power according to one or more inline power schemes, such as the IEEE 802.3af standard. The network segment 30 also includes powered device 34 that is configured to utilize inline power provided by power source equipment 32. The powered device classifying process not listed in FIG. 1 operates on the network segment 30. A wired data telecommunications network cable 36 couples power source equipment 32 and powered device 34, and has at least two pairs of conductors 38, 40. One pair of conductors 38 is illustrated here as the conductor 3-6 pair and the other pair of conductors 40, is illustrated as the conductor 1-2 pair. In accordance with this configuration, conductor pair 38 (i.e., 3-6) carries the more positive leg of the inline power and conductor pair 40 (i.e., 1-2) carries the less positive leg of the inline power. Additional pairs of conductors may be included as is well known to those of ordinary skill in the art. The power source equipment block 42 provides inline power to conductor pair 38 and conductor pair 40 at the power source equipment 32. The power source equipment block 42 reads return current from powered device 34, containing the powered device block 48. While multiple detect/class cycles are executed on 2-pairs, an alternate scheme where such an algorithm may apply to either set of pairs in a 4-pair cable or any combination thereof may be used.

Figure 2:
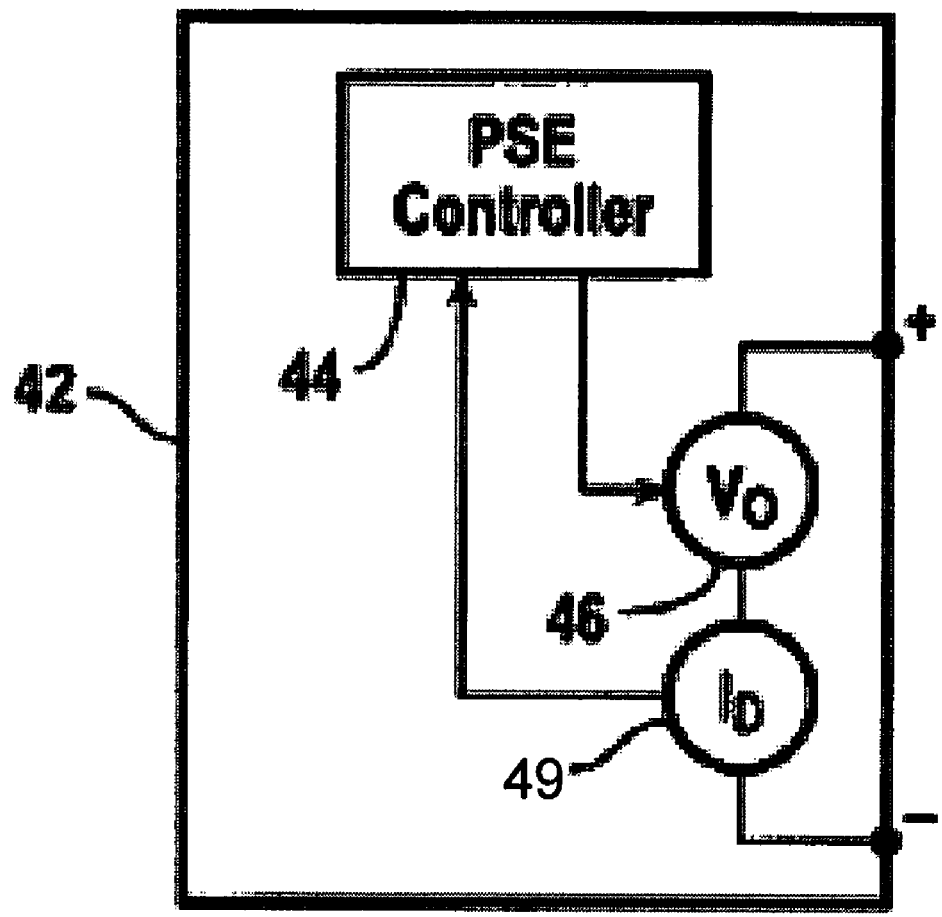
FIG. 2 illustrates an example configuration of block diagram of a portion of power sourcing equipment as disclosed herein.

FIG. 2 illustrates an example power source equipment block 42 containing a power source equipment controller 44 that controls the voltage output of a voltage injector 46, and receives a current indication from current detector 49. The voltage injector 46 is capable of a number of voltage outputs such as an idle state voltage output, an inline power detection voltage level, other voltage levels associated with the classification of the powered device 34, and a high voltage associated with inline power delivery, typically around −48V DC (direct current).

Figure 3:
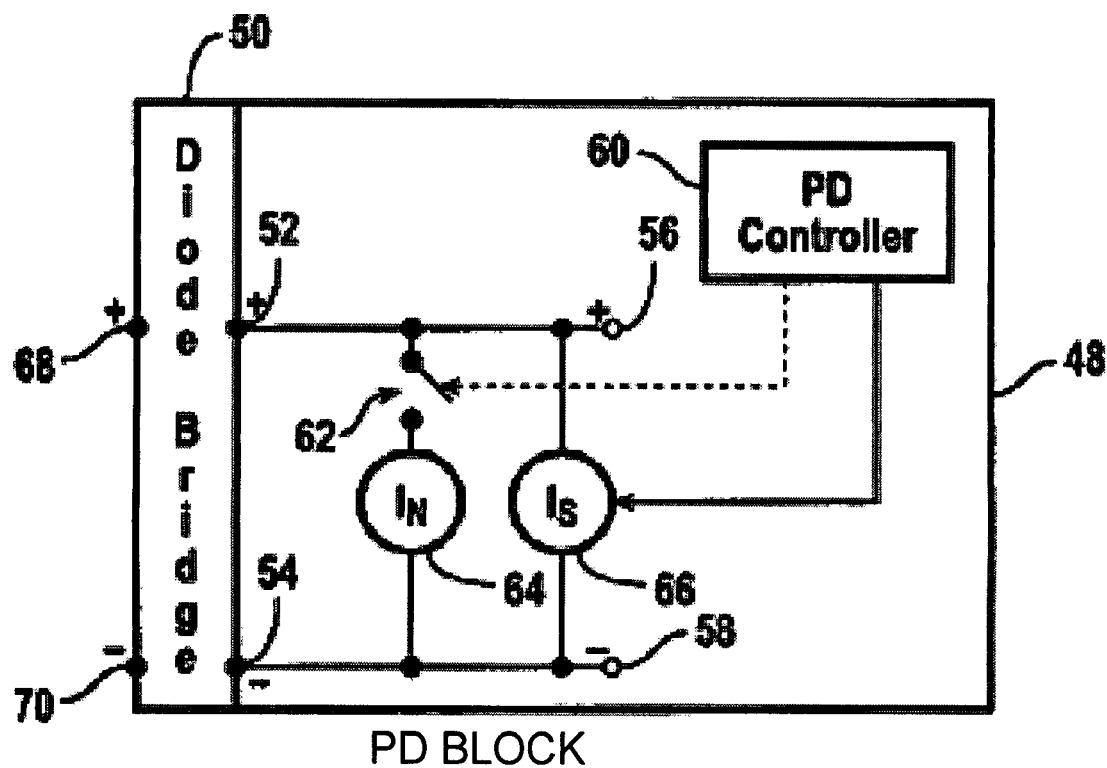
FIG. 3 illustrates an example configuration of block diagram of a portion of a powered device as disclosed herein.

FIG. 3 illustrates an example powered device block 48. The powered device block 48 receives the inline power over the wired data telecommunications network cable 36 as shown in FIG. 1. An optional diode bridge circuit 50 may be included. Voltage received at nodes 52 (+) and 54 (−) is used to power the powered device 34 via nodes 56 (+) and 58 (−), if the powered device 34 meets the requirements for receiving inline power. In order to determine if powered device 34 meets those requirements, the powered device block 48 first presents an identity network 64 to the power source equipment block 42 over the wired data telecommunications network cable 36, so that the ability of the powered device block 48 to utilize inline power may be confirmed. In accordance with the IEEE 802.3af standard, the identity network 64 is a predetermined resistance, such as a 25,000-ohm resistor. Other identity networks may also be used in accordance with other standards or techniques as is well known to those of ordinary skill in the art. The powered device controller 60 causes a switch 62 to close (or in an equivalent manner presents the identity network) coupling the identity network 64 to the wired data telecommunications network cable 36 so that it may be detected by the power source equipment block 42 during an inline power detection phase. At other times, the identity network 64 need not be presented, and thus switch 62 may be open. Switch 62 may be any circuit element capable of switching electrical current such as a relay, a solid-state relay, a diode, a transistor and the like. Alternatively, switch 62 may be omitted, and the identity network 64 presented at all times. In order for powered device block 48 to convey to power source equipment block 42 the amount of power (i.e., current) powered device block 48 requires, a current source device 66 (or a plurality of separately addressed current source devices, such as a current output DAC, which together form current source device 66) is controlled by powered device controller 60 to provide certain fixed current values across the wired data telecommunications network cable 36 back to power source equipment block 42 where the magnitudes of those currents are detected by current detector 49 and conveyed to power source equipment controller 44. The magnitude and order of a series of those presented currents drawn from the attached power source equipment 32, in response to application of the classification voltage, is used to convey information from powered device block 48 to power source equipment block 42. The information conveyed may be, for example, a maximum current desired by the powered device 34 from the power source equipment 32, but embodiments disclosed herein may be used to convey any kind of information from the powered device 34 to the power source equipment 32.

The diode bridge 50 is, for example, a conventional full wave bridge rectifier optionally provided to insure that if the wires are misconnected, that the more positive signal will be delivered from input nodes 68 and 70 to node 52 and the less positive signal will be delivered to node 54.

A plurality of classification cycles is carried out by the power source equipment block 42 on the powered device block 48. An advantage is that if the power source equipment block 42 attempts to repetitively classify a powered device block belonging to a "legacy" device which is unaware of, or unable to utilize this new capability, the legacy device will simply respond with the same current each time. The power source equipment 32 will then be able to verify that the device is a legacy device. On the other hand, if the legacy device responds with a series of current levels at least one of which is not the same as the others, then the power source equipment block 42 will be able to verify that the coupled powered device block 48 is capable of supplying the new power classes as described herein.

Figure 4:
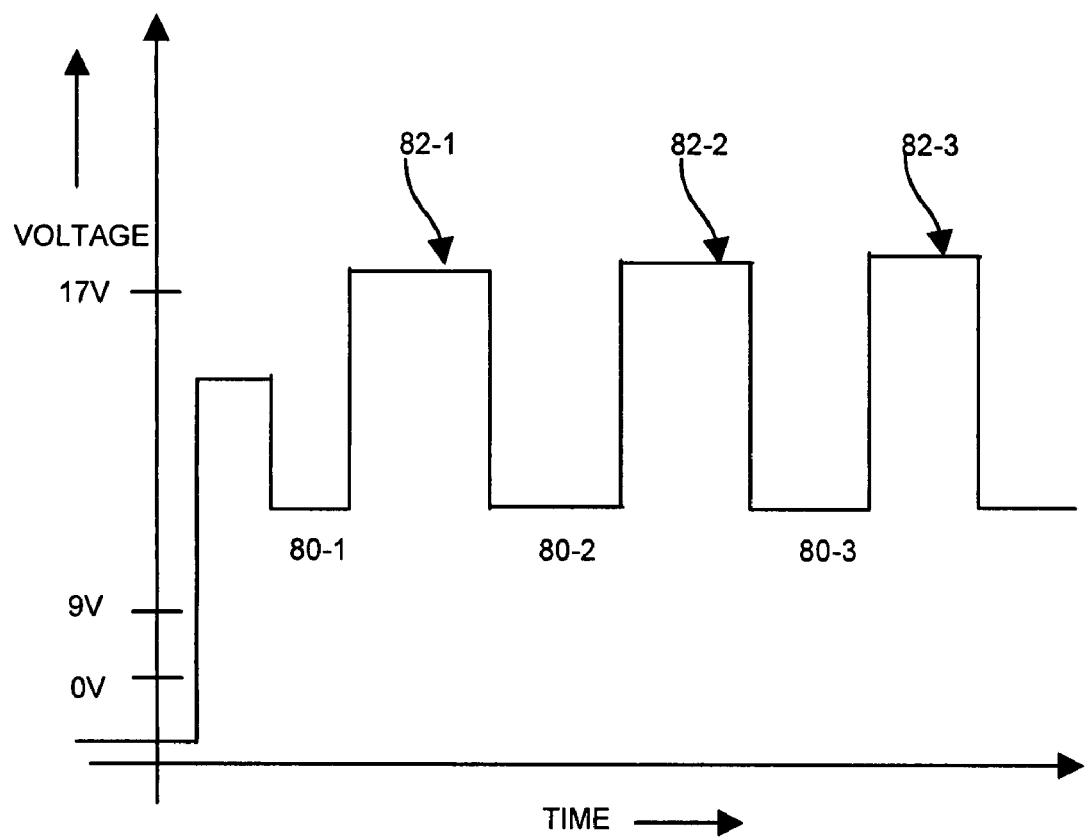
FIG. 4 illustrates an example graph depicting a powered device voltage versus time.

FIG. 4 illustrates an example graph depicting a powered device voltage versus time. In accordance with this embodiment, the power source equipment performs three detect and classification cycles. During the first detection phase 80-1, a voltage above the reset voltage level of the powered device 34 is applied to the powered device 34. Based on the current received (from the powered device 34) in response to the first detection phase 80-1, the powered device classifying process performs the first classification phase 82-1. The cycle is repeated for the second detection phase 80-2, and the second classification phase 82-2, and also for the third detection phase 80-3 and the third classification phase 82-3. During each of the three detection phases 80-1, 80-2, and 80-3, the voltage applied to the powered device 34 from the power source equipment 32 is above the reset voltage for the powered device 34, for example, nine volts. Each of the three classification phases results in a measured current that is correlated to a class. The three cycles (of detection and classification phases) result in three classes ordered in the sequence in which the three cycles are performed. The three classes are correlated to a final class. The final class determines the amount of inline power the power source equipment needs to deliver to the powered device.

FIG. 5 is a flowchart of the steps performed by the powered device classifying process when it conducts a plurality of cycles on the powered device 34, each cycle having a detection phase 80 and a classification phase 82.

In step 200, the powered device classifying process conducts a plurality of cycles on the powered device 34, each cycle having a detection phase 80 and a classification phase 82. Each cycle applies a classification voltage to the conductors 38, 40, and measures a current in the pair of conductors 38, 40 while the classification voltage is applied. Each cycle produces a resulting current that is used to determine a class associated with that measured current. In one embodiment, the IEEE 802.3af standard performs the cycle (detection phase 80 and a classification phase 82) in an infinite loop until power is applied.

In step 201, the powered device classifying process determines the powered device 34 is capable of storing a memory of a voltage received by the powered device 34. For example, the powered device 34 must retain a memory of having received the voltage at the media dependent interface MDI (RJ45). The MDI (RJ45) is a physical connection option for either IEEE 802.3 10BASE T (10 Mbps) or IEEE 802.3u 100BASE TX (100 Mbps) Ethernet connections. Also, the device may have a memory of what sequence of currents to present as multiple cycles of detect/class are executed across its inputs. It may also detect the presence of a legacy PSE or a new PSE capable of multiple detect/class cycles in a variety of ways.

In step 202, the powered device classifying process determines that the memory is retained by the powered device 34, when the powered device 34 receives a voltage of approximately eight to ten volts.

Alternatively, in step 203, the powered device classifying process determines that the memory of the powered device 34 is cleared when the powered device 34 receives a voltage of approximately three to five volts.

In step 204, the powered device classifying process determines and delivers a final class responsive to a plurality of measured currents based on the measured currents in the pair of conductors 38, 40. The final class is utilized to determine an amount of inline power to deliver to the powered device 34. In an example embodiment, each cycle produces a resulting current that is used to determine a class associated with that measured current. For example, the classification phase 82 of the cycle results in a measured current that correlates to a class. Three cycles results in three classes that, combined, are used to determine a final class that correlates to the amount of inline power to deliver to the powered device 34.

FIG. 6 is a flowchart of the steps performed by the powered device classifying process when it conducts a plurality of cycles on the powered device 34, each cycle having a detection phase 80 and a classification phase 82.

In step 205, the powered device classifying process conducts a plurality of cycles on the powered device 34, each cycle having a detection phase 80 and a classification phase 82. Each cycle applies a classification voltage to the conductors 38, 40, (i.e., the detection phase 80) and measures a current in the pair of conductors 38, 40 while the classification voltage is applied (i.e., the classification phase 82).

In step 206, the powered device classifying process conducts each cycle within the plurality of cycles, such that each cycle begins with a detection phase 80 followed by a classification phase 82. Each classification phase 82 applies a classification voltage to the conductors 38, 40, and measures the current in the pair of conductors 38, 40 while the classification voltage is applied. The plurality of cycles contains at least three cycles. Listed below is an example table of how the sequence of the three measured currents (produced as a result of the three cycles) are used to determine the final class. As noted in the table below, many 'codes' have not been assigned to convey a pre-agreed upon power class, or device characteristic (i.e., a sleep mode, a device requiring redundancy, or even minimum and maximum power levels.)

TABLE 1

| Sequence of measured currents from the three cycles | Final Class |
| --- | --- |
| 000 | 0 |
| 001 | |
| 010 | |
| 011 | |
| 100 | |
| 101 | |
| 110 | |
| 111 | 1 |
| 002 | |
| 020 | |
| 022 | |
| 200 | |
| 202 | |
| 220 | |
| 222 | 2 |
| 003 | |
| 030 | |
| 033 | |
| 300 | |
| 303 | |
| 330 | |
| 333 | 3 |
| 004 | |
| 040 | |
| 044 | |
| 400 | |
| 404 | |
| 440 | |
| 444 | 4 |
| 005 | |
| 050 | |
| 055 | |
| 500 | |
| 505 | |
| 550 | |
| 555 | 5 |

In step 207, the powered device classifying process conducts the detection phase 80 by applying a detection voltage of less than about ten volts, to establish that the powered device classifying process is communicating with a valid powered device 34. In an example embodiment, a current is applied and a voltage is measured across the pair of conductors 38, 40, during the subsequent classification phase 82.

In step 208, the powered device classifying process determines a class at the completion of each of the three cycles. The class, as shown in Table 1, is computed by the current measured in the pair of conductors 38, 40 during the classification phase 82 of each of the three cycles.

FIG. 7 is a flowchart of the steps performed by the powered device classifying process when it determines a final class responsive to a plurality of measured currents based on the measured currents in the pair of conductors 38, 40.

In step 209, the powered device classifying process determines a final class responsive to a plurality of measured currents based on the measured currents in the pair of conductors 38, 40. In an example embodiment, three cycles (of a detection phase 80 followed by a classification phase 82) are performed. Each of the three classification phases results in a measured current that correlates to a class, as shown in Table 1. The three cycles result in three classes ordered in the sequence in which the three cycles are performed. The three classes are correlated to a final class. The final class determines the amount of inline power the power source equipment 32 needs to deliver to the powered device 34.

In step 210, the powered device classifying process detects the plurality of cycles comprises three cycles, each cycle producing a class. Each class is associated with the measured current received at the powered device 34 during each of the three cycles. The sequence of the three classes matches the sequence in which the three cycles were completed. For example, if the first cycle results in a measured current that correlates to class 0, the second cycle results in a measured current that correlates to class 2, and the third cycle results in a measured current that correlates to class 2, then the resulting sequence is 022. In an example embodiment, the completion of the three cycles does not exceed 75 msec (an IEEE 802.3 requirement). The voltage supplied by the power source equipment 32 during the classification phase 82 is, for example, 17.5 volts during the first cycle. The voltage drops to no less than, for example, 9 volts for the detection phase 80 of the second cycle. The drop from 17.5 volts to 9 volts occurs in an estimated 1 msec. At the end of the third cycle, the voltage supplied by the power source equipment 32 drops to 2.8 volts. In one embodiment, the power source equipment 32 continues to deliver 2.8 volts for 100 msec. In an example embodiment, the first classification is required to be longer than 10 ms while subsequent classifications can support new time intervals as long as the total of classification period, for this classification extension, is below the 75 ms. The system benefits by having the initial classification period being longer than subsequent classification steps that are part of the extended classification process because legacy powered devices 34 work best at the expected midpoint of Tpdc (42 ms), and new powered devices 34 will benefit from having shorter classification steps because less heat will be dissipated in their circuits and this will make them more precise.

In another example embodiment, if the power source equipment 32 detects a short during the first cycle, then the sequence of three cycles is aborted and the second and third cycles are not performed.

Based on the order of the three cycles, in step 211, the powered device classifying process determines a final class associated with the amount of inline power to deliver to the powered device 34 from the power source equipment 32. In an example embodiment, the sequence 022 correlates to a final class of 1. In another example embodiment, the powered device 34 is an older, legacy, powered device 34. The legacy powered device 34 responds to the three cycles with the same measured current each time. The sequences of the three classes may be, for example, 222. This correlates to a final class of 2. Thus, the powered device classifying process is capable of classifying both the newer and the older powered devices 34. In an example embodiment, the powered device classifying process determines a final class associated with the amount of inline power to deliver to the powered device 34 from the power source equipment 32 based on the order of the three cycles and the values measured for each cycle.

In step 212, the powered device classifying process detects the plurality of cycles comprises a fourth cycle. The fourth cycle produces a fourth class that is used to determine the amount of inline power to deliver to the powered device 34. The amount of inline power is determined by adding an incremental value to the amount of inline power that was determined as a result of the three classes produced by the three cycles. In an example embodiment, the incremental value resides in the set of 0.5 watts, 1.0 watts, 1.5 watts and 2.0 watts. This allows for finer granularity in the incremental wattage added to the final class that is determined at the end of the three cycles.

For example, the three cycles (each cycle comprising a detection phase 80 followed by a classification phase 82) produce three classes, respectively 141, resulting in a total wattage of 15.5. The fourth cycle (comprising a detection phase 80 followed by a classification phase 82) results in adding an incremental value of two to the 15.5 watts for a total of 17.5 watts. Table 2 displays the results of four cycles and the resulting wattage necessary to deliver to the powered device 34. While in this example, the codes refer to wattage, it should be understood that in other embodiments, the code may be a device, identifier, etc.

TABLE 2

| CYCLE = | C1 + C2 + C3 Wattage | C4 | Total wattage |
|---|---|---|---|
| 0444 | 15.5 | 2 | 17.5 |
| 0141 | 15.5 | 0.5 | 18 |
| 0142 | 15.5 | 1 | 18.5 |
| 0141 | 15.5 | 1 | 18 |
| 0201 | 15.5 | 1 | 20 |
| 0202 | 15.5 | 1 | 20.5 |
| 0203 | 15.5 | 1.5 | 21 |
| 0204 | 15.5 | 2 | 21.5 |
| 0111 | 15.5 | 1 | 22 |
| 0112 | 15.5 | 1 | 22.5 |
| 0113 | 15.5 | 1.5 | 23 |
| 0211 | 15.5 | 0.5 | 23.5 |
| 0212 | 15.5 | 1 | 24 |
| 2024 | 7 | 2 | 24 |
| 0424 | 15.5 | 1.5 | 24 |
| 0213 | 15.5 | 1.5 | 24.5 |
| 214 | 15.5 | 2 | 25 |
| 214 | 15.5 | 2 | 25.5 |
| 220 | 15.5 | 0 | 26 |
| 10 | 15.5 | 0 | 26.5 |
| 11 | 15.5 | 0.5 | 27 |
| 12 | 15.5 | 1 | 27.5 |
| 13 | 15.5 | 1.5 | 28 |
| 14 | 15.5 | 2 | 28.5 |
| 20 | 15.5 | 0 | 29 |
| 20 | 15.5 | 0 | 29.5 |
| 21 | 15.5 | 0.5 | 30 |

By adding a single measurement of current, while keeping the cycles (comprising a detection phase 80 followed by a classification phase 82) limited to no more than three cycles, embodiments disclosed herein are more feasible technically and economically. The addition of the fourth cycle (comprising a detection phase 80 followed by a classification phase 82) allows the final wattage result to come within 200 mw of the maximum power required by the powered device 34 without having to resort to a physical or software based power management solution.

In an example embodiment, the fourth cycle of classification may have a double role, for example, ensuring mutual identification for the power source equipment and the powered device. The fourth cycle of classification may be introduced having a voltage outside the 15-20 v range specified by the 802.3af standard. The existence of such unique voltage (for example, between 20-30 v, or 10-15 v, and may have a designated length of time) at the end of the detect/class cycle, and after the powered device 34 delivered it class code, allows a new powered device 34 (not an 802.3af powered device 34) to detect the presence of a new power source equipment 32 by the responses of the multiple detection classification cycles. Based on this fact, such a detection enables the powered device 34 to remember the excursion outside the classification range at the end of the detect/class cycle, indicating the presence of a non-802.3af power source equipment 32 that is 802.3af compatible, but is capable of delivering more power, resources, or additional features.

In another example embodiment, at the end of the sequence of a detection phase 80 followed by a classification phase 82 the powered device 34 introduces a 'soft-short' condition at a predefined voltage range inside or outside the 802.3af classification voltages of 15-20 v, (within the 15-20 v, it may risk not being powered-due to an 802.3af specification that calls this a fault, but potentially such a powered device 34 may use that to its advantage) and measures the shorting current. The pre-agreed upon algorithm allows the powered device 34 to measure the 'short' current, and then removes such a short within a pre-determined time slot. Once the powered device 34 removes the short, the power source equipment 32 remains at the voltage indicated while the powered device 34 charge a local capacitor to keep the powered device's 34 memory powered if the powered device 34 relies on a capacitor, for that purpose, or to write such info to permanent memory that the powered device 34 has been discovered by a non-802.3af powered device 34. Also, a combination of these two algorithms may be used to detect legacy power source equipment 32 devices or any backward compatible 802.3af standard devices. It should be noted that the classification phase does not necessarily have to occur after three cycles, but can occur, for example, after two cycles, four cycles, etc.

In an example embodiment, a signature (i.e., voltage/current and duration in time) is used when determining that the powered device retains the memory. The signature has a lower bound that is above the powered device 34 reset level, and below the upper range of the classification voltage. During the process of classifying the powered device 34, each of the cycles may contain a detection phase, classification phase, and signature. The level and duration of the voltage needs to ensure a new powered device 34 sees this as a signature (and moves on to the next class level during the next classification step) while a legacy powered device 34 sees the voltage as either a detection or classification. It should be noted that the legacy powered device 34 always produces the same class.

Signatures increase the probability that a powered device 34 will correctly identify a new power source equipment 32. A legacy power source equipment 32 could produce a valid signature but the probability for this is low. There are many signatures that can be used. One signature may use the region between detection and classification, for example, 10 V to 15.5V. During the signature phase, the power source equipment 32 would produce 12.5V, and the new powered device 34 would respond with a current value below what the current class current level is (not necessarily a critical requirement). The new powered device 34 recognizes the signature, and enables the powered device 34 to move to the next class level, if it is classified.

The system disclosed herein helps to reduce the chance of miss communications of the classification by ensuring that repeated class values represent legacy powered devices 34. In an example embodiment, cycles that result in codes that start with 4 permit the same or higher power levels than legacy classes. The power classes may be extended to represent the maximum power level using the same power level as legacy powered devices 34, based on the valued that is determined by the first cycle. Subsequent power levels (as determined by subsequent cycles) refine the power levels represented by the code. This ensures that a legacy power source equipment 32 that sees a first class level grants power based on that class to the new powered device 34. The new powered device 34 operates because the new powered device 34 has been granted more power than it needs.

While the system and method have been particularly shown and described with references to configurations thereof, it will be understood by those skilled in the art that various changes in form and details may be made therein without departing from the scope of the embodiments disclosed herein encompassed by the appended claims. Accordingly, the present embodiments disclosed herein are not intended to be limited by the example configurations provided above.

What is claimed is:

1. A method for classifying a powered device coupled to power sourcing equipment to receive inline power from the power sourcing equipment in a wired data telecommunications network having at least two pairs of conductors coupling the powered device and the power sourcing equipment, the method comprising:
   conducting a plurality of cycles on at least the two pairs of conductors of the powered device, each cycle having a detection phase and a classification phase, a classification voltage applied to the conductors during each classification phase, and measuring a current in the conductors while the classification voltage is applied; and
   determining a final class responsive to the measured currents of each of the plurality of cycles, the final class utilized to determine an amount of inline power to deliver to the powered device.

2. The method of claim 1 wherein conducting a plurality of cycles on the powered device, each cycle having a detection phase and a classification phase comprises:
   conducting each cycle within the plurality of cycles such that each cycle begins with a detection phase followed by a classification phase, each of the classification phase applying a respective classification voltage to the conductors, and measuring the current in the conductors while the classification voltage is applied, the plurality of cycles containing at least two cycles; and
   determining a respective class at the completion of each of the at least two cycles, the respective class computed by the current measured in the conductors.

3. The method of claim 2 wherein conducting each cycle within the plurality of cycles such that each cycle begins with a detection phase followed by a classification phase comprises:
   conducting the detection phase by applying at least one detection voltage of less than the classification voltage to detect a valid powered device.

4. The method of claim 2 wherein conducting each cycle within the plurality of cycles such that each cycle begins with a detection phase followed by a classification phase comprises:
   conducting the detection phase by applying at least one detection current to detect a valid powered device.

5. The method of claim 1 wherein determining a final class responsive to the measured currents comprises:
   detecting the plurality of cycles comprises three cycles, each of the three cycles producing a class, each class associated with the measured current received at the powered device during each of the three cycles, each of the three classes received in an order in which each of the three cycles is completed; and
   based on the order in which the three cycles were received, determining a final class associated with the amount of inline power to deliver to the powered device.

6. The method of claim 5 comprising:
   detecting the plurality of cycles comprises a fourth cycle producing a fourth class that is used to determine the amount of inline power to deliver to the powered device by adding an incremental value to the amount of inline power that is determined as a result of the three classes produced by the three cycles.

7. The method of claim 1 wherein conducting a plurality of cycles on the powered device, comprises:
   conducting at least one cycle having a signature phase by applying a signature voltage different from the classification voltage, where the signature voltage identifies a type of the power sourcing equipment to the powered device.

8. The method of claim 1 further comprising:
   conducting a mutual identification cycle by applying a voltage to the conductors that is different than the classification voltage and causes the powered device to detect a type of the power sourcing equipment.

9. Power sourcing equipment adapted to classify a coupled powered device so that the powered device can receive inline power from the power sourcing equipment in a wired data telecommunications network having at least two pairs of conductors coupling the powered device and the power sourcing equipment, the power sourcing equipment comprising:
   circuitry for conducting a plurality of cycles on at least the two pairs of conductors for at least one classification procedure having a detection phase and a classification phase, the at least one classification procedure comprising a classification voltage applied to the conductors during each classification phase; and measuring the current in the conductors while the classification voltage is applied; and
   circuitry for providing an amount of inline power responsive to the measured currents of each of the plurality of cycles.

10. The power sourcing equipment of claim 9 wherein the circuitry for conducting a plurality of cycles for at least one classification procedure comprises:
    circuitry for conducting each cycle within the plurality of cycles such that each cycle begins with a detection phase followed by a classification phase, each of the classification phase applying a classification voltage to the conductors during each cycle, and circuitry for measuring the current in the conductors while the classification voltage is applied, the plurality of cycles containing at least two cycles; and
    circuitry for determining a respective class at the completion of each of the at least two cycles, the class computed by the current measured in the conductors.

11. The power sourcing equipment of claim 10 wherein the circuitry for determining a respective class at the completion of each of the at least two cycles comprises:
    circuitry for detecting that the plurality of cycles comprises three cycles, each of the three cycles producing a class, each class associated with the measured current received at the powered device during each of the three cycles, each of the three classes received in the order in which each of the three cycles, within the plurality of cycles, was completed; and circuitry for determining a final class associated with the amount of inline power to deliver to the powered device, based on the order of the three cycles.

12. The circuitry of claim 11 comprising:
circuitry for detecting the plurality of cycles comprises a fourth cycle producing a fourth class that is used to determine the amount of inline power to deliver to the powered device by adding an incremental value to the amount of inline power that is determined as a result of the three classes produced by the three cycles.

13. The power sourcing equipment of claim 9 further comprising:
circuitry for conducting a mutual identification cycle by applying a voltage to the conductors that is different than the classification voltage and causes the powered device to detect a type of the power sourcing equipment.

14. The power sourcing equipment of claim 9 further comprising:
circuitry for conducting at least one cycle having a signature phase by applying a signature voltage different from the classification voltage, where the signature voltage identifies a type of the power sourcing equipment to the powered device.

15. A powered device adapted to operate in conjunction with a coupled power sourcing equipment so that the powered device can receive inline power from the power sourcing equipment in a wired data telecommunications network having at least two pairs of conductors coupling the powered device and the power sourcing equipment, the powered device comprising:
circuitry responsive to a plurality of cycles on at least the two pairs of conductors, each cycle having a detection phase and a classification phase, the cycles produced by the power sourcing equipment, the circuitry presenting a series of currents over the conductors to the power sourcing equipment responsive to a classification voltage applied during the classification phase of each of the plurality of cycles, the currents collectively corresponding to predetermined inline power classes.

16. The powered device of claim 15 further comprising:
circuitry for identifying a mutual identification cycle by detecting a voltage to the conductors that is different than the classification voltage, to thereby allow the powered device to detect a type of the power sourcing equipment.

17. The powered device of claim 15 further comprising:
circuitry for identifying at least one cycle having a signature phase comprising a signature voltage different from the classification voltage, where the signature voltage identifies a type of the power sourcing equipment to the powered device; and
circuitry for responding to the signature phase.

18. A computer system comprising:
a memory;
a processor;
a communications interface;
an interconnection mechanism coupling the memory, the processor and the communications interface;
wherein the memory is encoded with a powered device classifying application that when executed on the processor configures the processor to perform an operation for classifying a powered device, the operation including:
conducting a plurality of cycles on at least two pairs of the conductors coupled to the powered device, each cycle having a detection phase and a classification phase, a classification voltage applied to the conductors during each classification phase, and measuring a current in the conductors while the classification voltage is applied; and
determining a final class responsive to the measured currents for each of the plurality of cycles, the final class utilized to determine an amount of inline power to deliver to the powered device.

19. The computer system of claim 18 wherein the operation further comprises:
conducting a mutual identification cycle by applying a voltage to the conductors that is different than the classification voltage and causes the powered device to detect a type of the power sourcing equipment.

20. The computer system of claim 18 wherein the operation further comprises:
conducting at least one cycle having a signature phase by applying a signature voltage different from the classification voltage, where the signature voltage identifies a type of the power sourcing equipment to the powered device.

21. A computer readable medium encoded with computer programming logic that when executed on a process in a computerized device provides powered device classification, the medium comprising:
instructions for conducting a plurality of cycles on at least two pairs of conductors coupled to the powered device, each cycle having a detection phase and a classification phase, a classification voltage applied to the conductors during each classification phase, and measuring a current in the conductors while the classification voltage is applied; and
instructions for determining a final class responsive to the measured currents for each of the plurality of cycles, the final class utilized to determine an amount of inline power to deliver to the powered device.

* * * * *